United States Patent
Lei et al.

(10) Patent No.: US 9,343,366 B2
(45) Date of Patent: *May 17, 2016

(54) DICING WAFERS HAVING SOLDER BUMPS ON WAFER BACKSIDE

(71) Applicant: Applied Materials, Inc., Santa Clara, CA (US)

(72) Inventors: Wei-Sheng Lei, San Jose, CA (US); James S. Papanu, San Rafael, CA (US); Aparna Iyer, Sunnyvale, CA (US); Brad Eaton, Menlo Park, CA (US); Ajay Kumar, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/543,747

(22) Filed: Nov. 17, 2014

(65) Prior Publication Data
US 2015/0303111 A1 Oct. 22, 2015

Related U.S. Application Data

(63) Continuation of application No. 14/254,632, filed on Apr. 16, 2014, now Pat. No. 8,912,078.

(51) Int. Cl.
*H01L 21/00* (2006.01)
*H01L 21/78* (2006.01)
(Continued)

(52) U.S. Cl.
CPC ............... *H01L 21/78* (2013.01); *H01L 21/268* (2013.01); *H01L 21/3065* (2013.01);
(Continued)

(58) Field of Classification Search
CPC ........................................................ H01L 21/78
See application file for complete search history.

(56) References Cited

U.S. PATENT DOCUMENTS

| 4,049,944 A | 9/1977 | Garvin et al. |
|---|---|---|
| 4,339,528 A | 7/1982 | Goldman |

(Continued)

FOREIGN PATENT DOCUMENTS

| JP | 9216085 | 8/1997 |
|---|---|---|
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Angel Roman
(74) *Attorney, Agent, or Firm* — Blakely Sokoloff Taylor Zafman LLP

(57) ABSTRACT

Approaches for hybrid laser scribe and plasma etch dicing process for a wafer having backside solder bumps are described. For example, a method of dicing a semiconductor wafer having integrated circuits on a front side thereof and corresponding arrays of metal bumps on a backside thereof involves applying a dicing tape to the backside of the semiconductor wafer, the dicing tape covering the arrays of metal bumps. The method also involves, subsequently, forming a mask on the front side of the semiconductor wafer, the mask covering the integrated circuits. The method also involves forming scribe lines on the front side of the semiconductor wafer with a laser scribing process, the scribe lines formed in the mask and between the integrated circuits. The method also involves plasma etching the semiconductor wafer through the scribe lines to singulate the integrated circuits, the mask protecting the integrated circuits during the plasma etching.

7 Claims, 9 Drawing Sheets

(51) Int. Cl.
  *H01L 21/683*    (2006.01)
  *H01L 21/268*    (2006.01)
  *H01L 21/3065*   (2006.01)
  *H01L 25/065*    (2006.01)
  *H01L 23/00*     (2006.01)

(52) U.S. Cl.
  CPC ............ *H01L 21/6836* (2013.01); *H01L 24/05* (2013.01); *H01L 24/13* (2013.01); *H01L 24/16* (2013.01); *H01L 25/0657* (2013.01); *H01L 2221/6834* (2013.01); *H01L 2221/68327* (2013.01); *H01L 2221/68381* (2013.01); *H01L 2224/0401* (2013.01); *H01L 2224/0557* (2013.01); *H01L 2224/05568* (2013.01); *H01L 2224/13025* (2013.01); *H01L 2224/16145* (2013.01); *H01L 2224/16225* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/12041* (2013.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,482,702 B2 | 1/2009 | Farnsworth et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,105,875 B1 | 1/2012 | Hu et al. | |
| 8,759,150 B2 | 6/2014 | Hu et al. | |
| 8,912,078 B1 * | 12/2014 | Lei et al. ...................... | 438/462 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0189031 A1 | 8/2006 | Kado et al. | |
| 2006/0205182 A1 | 9/2006 | Soejima | |
| 2008/0318396 A1 | 12/2008 | Shin et al. | |
| 2009/0189279 A1 | 7/2009 | How | |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0267076 A1 | 10/2013 | Lei et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

Lei, Wei-Sheng et al., "Wafer Dicing From Wafer Backside and Front Side," U.S. Appl. No. 14/103,534, filed Dec. 11, 2013, 36 pgs.

Lei8, Wei-Sheng, et al., "Dicing Processes for Thin Wafers With Bumps on Wafer Backside," U.S. Appl. No. 14/226,038, filed Mar. 26, 2014, 42 pgs.

International Search Report and Written Opinion from PCT/US2015/025060 mailed Jul. 27, 2015, 11 pgs.

* cited by examiner

DICING WAFERS HAVING SOLDER BUMPS ON WAFER BACKSIDE

CROSS-REFERENCE TO RELATED APPLICATIONS

This application is a continuation of U.S. patent application Ser. No. 14/254,632, filed on Apr. 16, 2014, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having integrated circuits on a front side thereof and corresponding arrays of metal bumps on a backside thereof involves applying a dicing tape to the backside of the semiconductor wafer, the dicing tape covering the arrays of metal bumps. The method also involves, subsequently, forming a mask on the front side of the semiconductor wafer, the mask covering the integrated circuits. The method also involves forming scribe lines on the front side of the semiconductor wafer with a laser scribing process, the scribe lines formed in the mask and between the integrated circuits. The method also involves plasma etching the semiconductor wafer through the scribe lines to singulate the integrated circuits, the mask protecting the integrated circuits during the plasma etching.

In another embodiment, a method of dicing a semiconductor wafer having integrated circuits on a front side thereof and corresponding arrays of metal bumps on a backside thereof involves providing the semiconductor wafer having a dicing tape applied to the backside thereof. The dicing tape covers the arrays of metal bumps. The semiconductor wafer also has a mask formed on the front side thereof. The mask covers the integrated circuits. The method also involves forming scribe lines on the front side of the semiconductor wafer with a laser scribing process, the scribe lines formed in the mask and between the integrated circuits. The method also involves plasma etching the semiconductor wafer through the scribe lines to singulate the integrated circuits, the mask protecting the integrated circuits during the plasma etching.

In another embodiment, a method of dicing a semiconductor wafer having integrated circuits on a front side thereof and corresponding arrays of metal bumps on a backside thereof involves providing the semiconductor wafer having a dicing tape applied to the backside thereof. The dicing tape covers the arrays of metal bumps. The semiconductor wafer also has a mask formed on the front side thereof. The mask covers the integrated circuits. Scribe lines are formed in the mask and between the integrated circuits. The method also involves plasma etching the semiconductor wafer through the scribe lines to singulate the integrated circuits. The mask protects the integrated circuits during the plasma etching.

BRIEF DESCRIPTION OF THE DRAWINGS

FIG. 2A illustrates a starting semiconductor substrate or wafer having backside solder bumps formed thereon;

FIG. 2B illustrates the structure of FIG. 2A following mounting, via the backside, to a dicing film or tape;

FIG. 2C illustrates the structure of FIG. 2B following demounting of the semiconductor substrate or wafer from a front side carrier tape;

FIG. 2D illustrates the structure of FIG. 2C following formation of a dicing mask as applied to the front side of the semiconductor substrate or wafer;

FIG. 2E illustrates the structure of FIG. 2D following scribing of the dicing mask and the streets from the semiconductor substrate or wafer front side with a laser scribing process; and FIG. 2F illustrates the structure of FIG. 2E following plasma etching to singulate the semiconductor substrate or wafer into individual ICs.

DETAILED DESCRIPTION

Figure 1A:
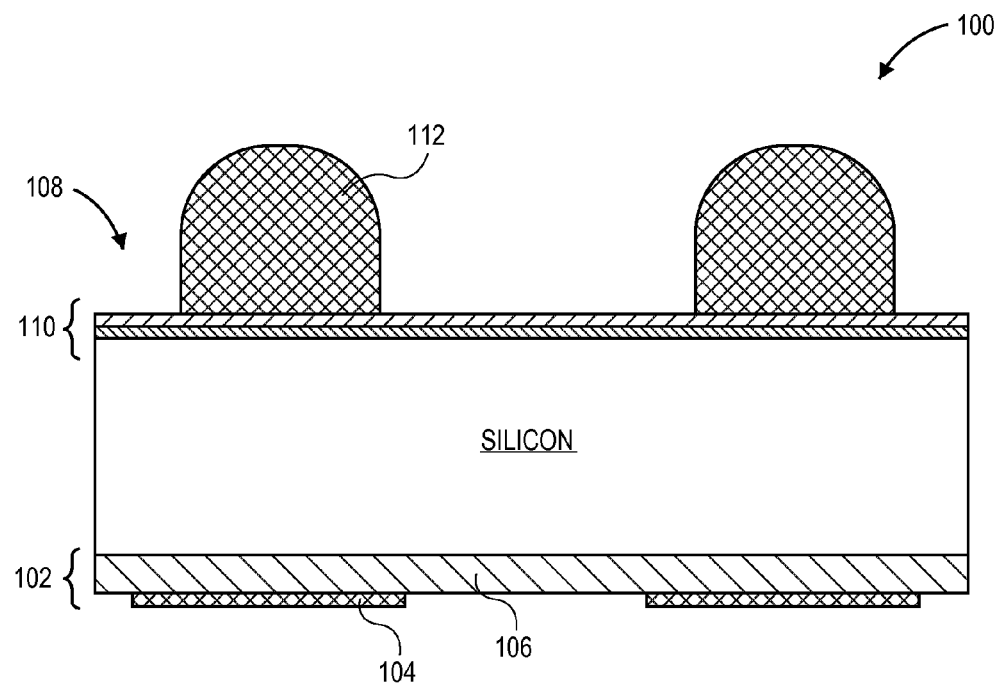
FIG. 1A illustrates a cross-sectional view of a backside-bumped die, in accordance with an embodiment of the present invention.

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving initial laser scribing processes and subsequent plasma treatment may be implemented for die singulation. The laser scribe process may be used to cleanly remove one or more of a mask layer, organic and inorganic dielectric layers, and device layers on a front side of a wafer, as well as cut into the substrate. A plasma etch or treatment portion of the dicing process may then be employed to yield clean die or chip singulation or dicing. Particular embodiments are directed to hybrid laser scribe and plasma etch dicing processes for wafers having backside solder bumps already formed thereon.

To provide context, emerging applications, such as the logic chip/memory chip hybrid structures, for three-dimensional (3D) packaging purposes, can involve an arrangement of solder bumps on a wafer backside for dies intended for stacking. For example, in one case, a logic die has its bumps on the backside. When the logic die is stacked onto printed circuit board (PCB) packaging substrate, the backside is connected to the substrate through the bumps. On a second stacking layer, a memory die with its bumps on the front side, is stacked with its device layer (front side) onto the backside of the logic die, etc. Dicing a wafer with bumps on its backside can be problematic using conventional blade sawing or laser full thickness dicing. Since, in both cases, in order to maintain the rigidity of the wafer during dicing, the much flatter front (device) side is mounted onto a dicing tape. Meanwhile, the backside with bumps faces the saw blade or laser for cutting to avoid the waviness of the bumps. After completion of the dicing process, there may be risks that the most delicate device side is bonded onto dicing tape and becomes hard to pick from the tape. The so-called laser resistant dicing tape has been developed to mitigate this issue but, depending on the laser intensity, there is really no such polymer based tape resistant to laser.

Accordingly, one or more embodiments are directed to wafer or substrate dicing using hybrid laser scribe and plasma etch dicing process. At least some embodiments include methods and systems to dice wafers with backside metal bumps formed thereon. For example, in three-dimensional (3D) logic chip/memory chip stacking applications, metal bumps having a height as high as 100 microns or more are placed on the backside of a wafer. The bump formation as a backend process is realized after device layers are completed on front side and the wafer is subsequently thinned from backside. As mentioned above, directly dicing a thin device wafer with tall bumps on backside can be very challenging. For example, blade dicing from the device side can cause mechanical stress due to uneven mounting of wafers from backside caused by bumps. In the case that a low k dielectric device layer is included, blade dicing from either side can lead to low k material fracturing and delamination, peeling, etc. Full thickness laser dicing such as processes using nanosecond ultraviolet (UV) lasers can glue the singulated dies onto the dicing tape materials, making them hard to pick. Furthermore, conventionally, dicing prior to grinding has been deployed but this is limited to the applications where once backside grinding and polishing is completed, no further processes or functional layers are added onto backside. Embodiments described herein may address one or more of the above highlighted issues.

It is to be appreciated that processes described herein can be used to accommodate fabrication of a variety of architectures involving backside bumping on a semiconductor die. In a first example, FIG. 1A illustrates a cross-sectional view of a backside-bumped die, in accordance with an embodiment of the present invention. Referring to FIG. 1A, a semiconductor structure 100, such as a logic die, has an active surface 102 having metal pads 104 on a device layer 106. The device layer may include a semiconductor device layer and associated dielectric (including low-k layers) and metallization layers. A backside 108 of the structure 100 includes dielectric and/or passivation layers 110, as well as solder bumps 112, such as copper bumps.

Figure 1B:
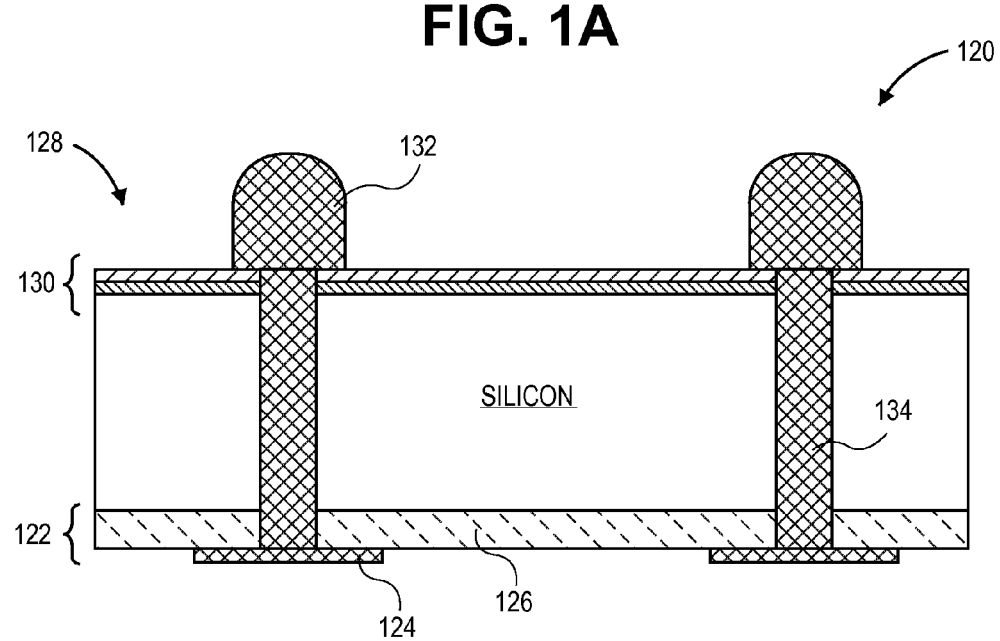
FIG. 1B illustrates a cross-sectional view of another backside-bumped die, in accordance with another embodiment of the present invention.

In a second example, FIG. 1B illustrates a cross-sectional view of another backside-bumped die, in accordance with another embodiment of the present invention. Referring to FIG. 1B, a semiconductor structure 120, such as a memory die, has an active surface 122 having metal pads 124 on a device layer 126. The device layer may include a semiconductor device layer and associated dielectric (including low-k layers) and metallization layers. A backside 128 of the structure 120 includes dielectric and/or passivation layers 130, as well as solder bumps 132, such as copper bumps. Through silicon vias (TSVs) 134 connect the pads 124 with the bumps 132 and run through the silicon substrate.

Figure 1C:
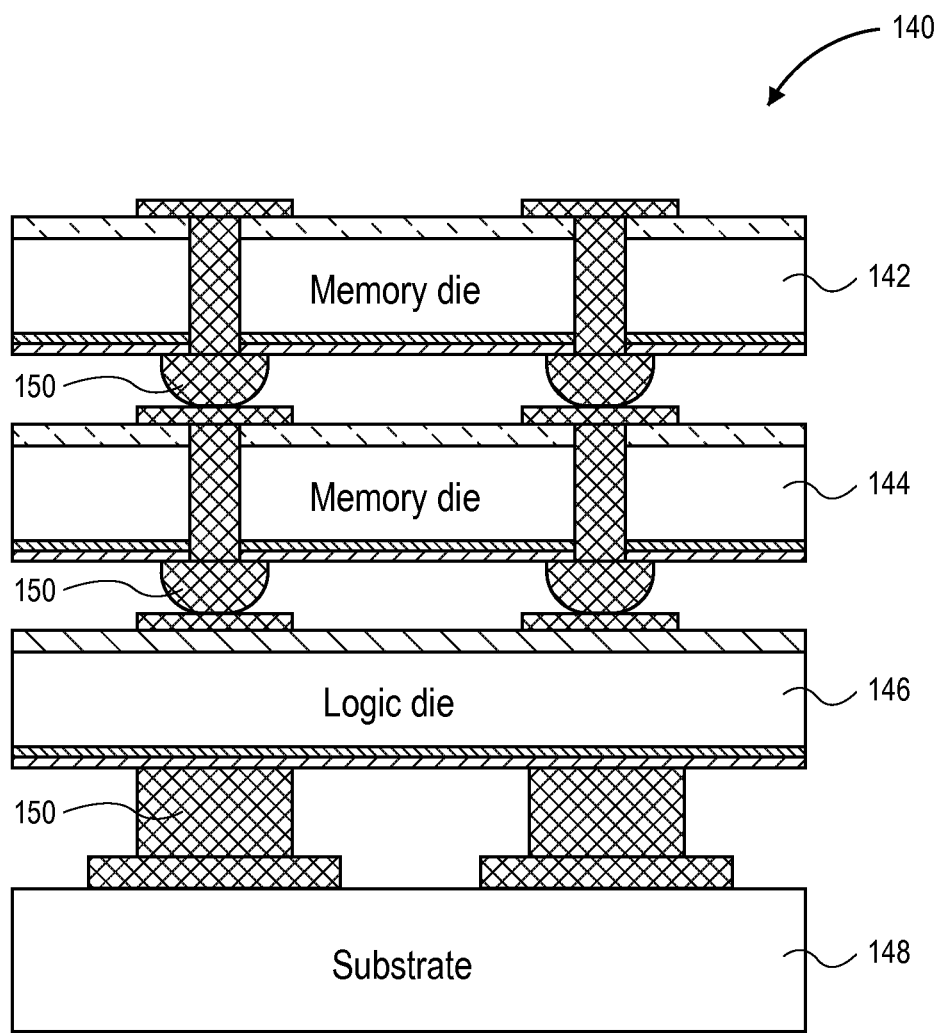
FIG. 1C illustrates a cross-sectional view of a stack of backside-bumped dies as coupled to a package substrate, in accordance with an embodiment of the present invention.

In a third example, FIG. 1C illustrates a cross-sectional view of a stack of backside-bumped dies as coupled to a package substrate, in accordance with an embodiment of the present invention. Referring to FIG. 1C, a logic die/memory die hybrid 3-D stacking structure 140 includes a first backside-bumped memory die 142 coupled to a second backside-bumped memory die 144. The second backside-bumped memory die 144 is coupled to a logic die 146. The logic die 146 is coupled to a package substrate 148. As depicted in FIG. 1C, the coupled can be effected by use of backside bumps 150 and TSVs 152. It is to be appreciated that, although not depicted in FIG. 1C, an underfill material may be included between substrate/die, or die/die in final products as a passivation layer.

Accordingly, as described in greater detail below, one or more embodiments involve dicing of a wafer having bumps formed thereon. As an example, FIGS. 2A-2F illustrate cross-sectional views representing various operations in a hybrid laser scribe and plasma etch dicing process for a wafer having backside solder bumps, in accordance with an embodiment of the present invention.

Figure 2A:
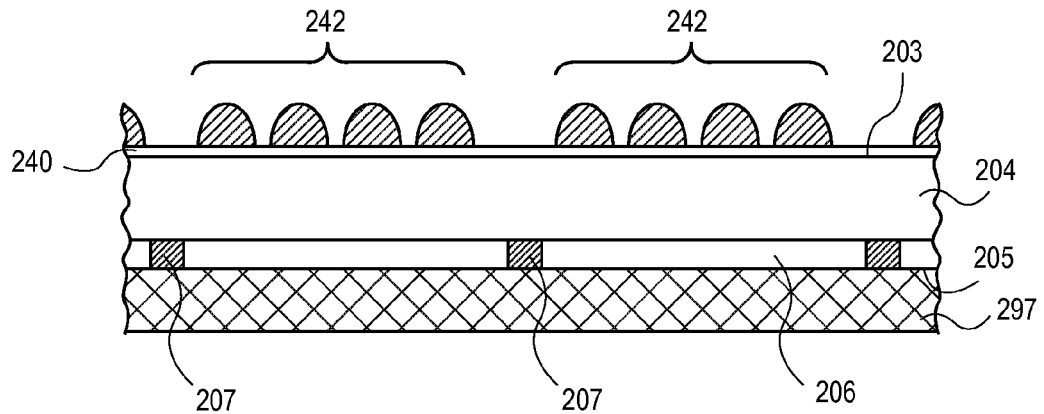
FIGS. 2A-2F illustrate cross-sectional views representing various operations in a hybrid laser scribe and plasma etch dicing process for a wafer having backside solder bumps, in accordance with an embodiment of the present invention, where.

Referring to FIG. 2A, a semiconductor substrate or wafer 204 (only a portion of which is shown) has a backside 203 and a front side 205. The semiconductor substrate or wafer 204 front side 205 has integrated circuits 206 thereon. The integrated circuits 206 are separated by streets 207, which may include metallization and dielectric layers similar to those of the integrated circuits 206. For example, streets 207 may be composed of layers of dielectric materials, semiconductor materials, and metallization. In one embodiment, one or more of the streets 207 includes test devices similar to the actual devices of the integrated circuits 206. In other embodiments, however, test devices and associated materials are not included in the streets 207. It is to be appreciated that the integrated circuits 206 (and the streets 207) need not be planar as shown. Instead, topography may be present due to the inclusion of bumps/pillars and other like features.

Referring again to FIG. 2A, at this stage, the semiconductor substrate or wafer 204 has already been thinned from the backside 203 to provide a final thickness for the semiconductor substrate or wafer 204. The thinning may involve a backside grind process. One or more passivation layers 240 are then formed on the wafer backside 203. Arrays 242 of backside metal bumps are then formed on the one or more passivation layers 240 on the backside 203. It is to be appreciated that each array 242 depicted in FIG. 2A represents a plurality of metal bumps that can be formed to any suitable thickness and pitch. Also, as depicted the arrays may be fabricated in alignment with the integrated circuits 206 but not over regions corresponding to the streets 207. In an embodiment, the each array 242 of backside 203 metal bumps includes solder bumps and corresponding pads. In one embodiment, the metal bumps are composed substantially of copper, but embodiments are not so limited. In one embodiment, the final thickness of the semiconductor substrate or wafer 204 is less than approximately 300 microns. In one such embodiment, the final thickness of the semiconductor substrate or wafer 204 is less than approximately 100 microns.

Referring again to FIG. 2A, in an embodiment, the semiconductor substrate or wafer 204 is attached to a carrier film or tape 297, such as the tape of a substrate carrier. Although not shown, it is to be appreciated that the carrier film or tape 297 may be surrounded by a tape frame. More generally, following front end device fabrication, the semiconductor substrate or wafer 204 may be mounted via the front side 205 on a carrier for thinning, backside passivation layer growth, and bump formation. After wafer backside patterning is finished, the semiconductor substrate or wafer 204 may be demounted from the carrier, cleaned and transferred onto the carrier film or tape 297, as is depicted in FIG. 2A. In one embodiment, the carrier film or tape 297 is a UV-curable carrier film or tape 297, in that its adhesion to the semiconductor substrate or wafer 204 weakens upon exposure to UV irradiation.

Figure 2B:
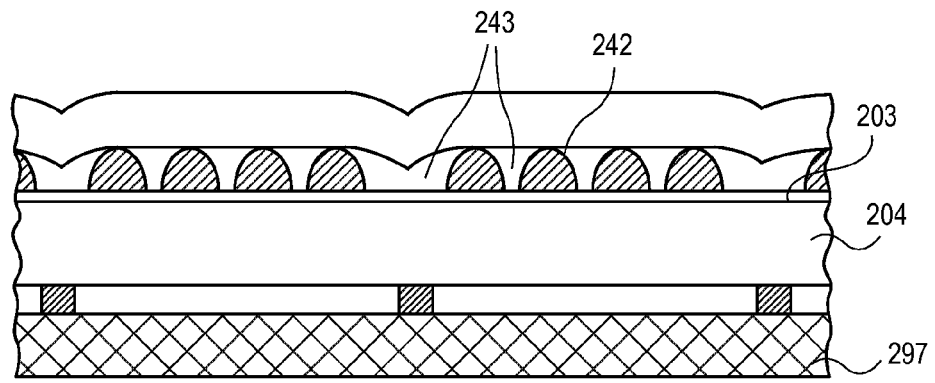

Referring to FIG. 2B, the semiconductor substrate or wafer 204 is mounted, via the backside 203, to a dicing film or tape 298. Although not shown, it is to be appreciated that the dicing film or tape 298 may be surrounded by a tape frame. In one embodiment, the dicing film or tape 298 is a UV-curable dicing film or tape 298, in that its adhesion to the semiconductor substrate or wafer 204 weakens upon exposure to UV irradiation. In another embodiment, the dicing film or tape 298 is a thermally-curable dicing film or tape 298, in that its adhesion to the semiconductor substrate or wafer 204 weakens upon exposure to heat. In either case, in one embodiment, the dicing film or tape 298 is applied using a dry film vacuum lamination technique.

Referring again to FIG. 2B, in an embodiment, dry film vacuum lamination is used to mount the semiconductor substrate or wafer 204 backside 203 on the dicing tape 298 since it eliminates air bubbles that can otherwise be embedded between bumps 242 if the mounting is performed in air. It is to be appreciated that a trapped air bubble between the semiconductor substrate or wafer 204 and dicing tape 298 might lead to catastrophic wafer damage during plasma etching. Thus, in one embodiment, an evacuated, low-pressure and air-bubble-free region 243 is formed between the bumps 242 and the dicing film or tape 298. In a specific embodiment, the region 243 is a void having a pressure substantially less than 1 atm, e.g., less than 0.2 atm. In one embodiment, the dicing film or tape 298 has a thick adhesive/release film(s) thereon which may be preferable in order to achieve smooth (e.g., non-wavy) mounting of the dicing film or tape 298 on the semiconductor substrate or wafer 204. Also, although not shown relatively, in an embodiment, a thickness of the dicing film or tape 298 is approximately 90 microns, while a height of the bumps 242 is up to approximately 50 microns.

Figure 2C:
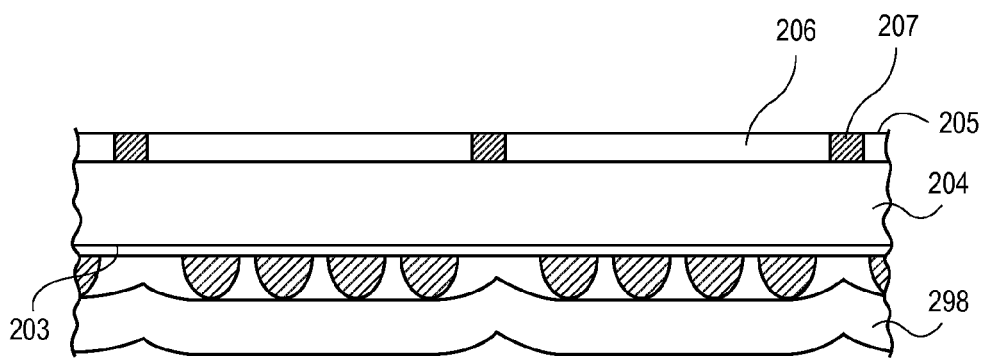

Referring to FIG. 2C, in the case that the semiconductor substrate or wafer 204 is received as already mounted onto a carrier tape 297 with its front device side 205 in contact with the carrier tape 297, the semiconductor substrate or wafer 204 is demounted from the carrier tape 297. In one such embodiment, the carrier tape 297 is a UV-curable tape and is released with the assistance of UV irradiation. It is to be appreciated that the ordering of FIGS. 2B and 2C may be reversed, in that the tape 297 may be released prior to adhesion of tape 298.

Figure 2D:
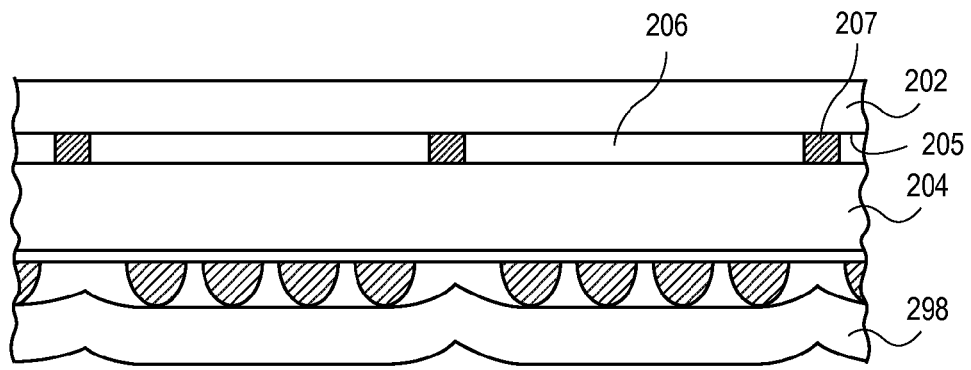

Referring to FIG. 2D, a dicing mask 202 is applied to the front side 205 of the semiconductor substrate or wafer 204 and, in one embodiment, covers the streets 207 and the integrated circuits 206. Suitable mask materials are described in greater detail below. In a particular embodiment, the dicing mask 202 includes or is a water soluble mask layer applied by dry film vacuum lamination or spin coating or other wet coating technique.

Figure 2E:
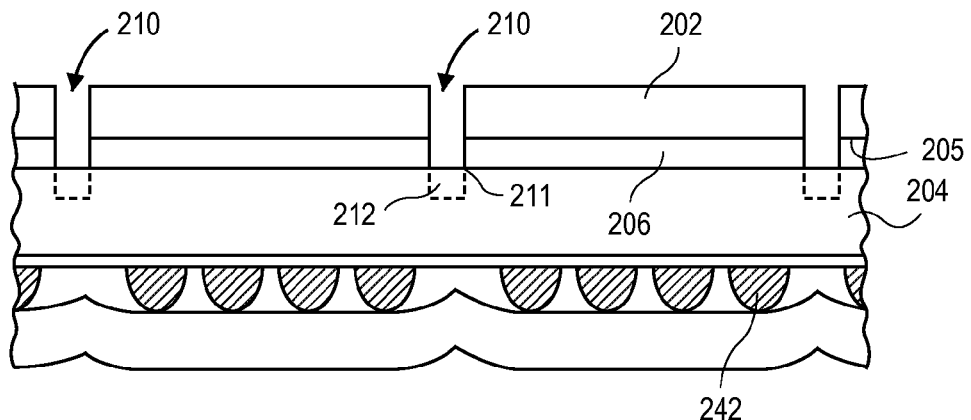

Referring to FIG. 2E, the dicing mask 202 and the streets 207 are scribed from the semiconductor substrate or wafer 204 front side 205 with a laser scribing process to provide laser scribe lines 210, and to remove the material from streets 207. The laser scribe lines 210 may terminate at the surface 211 of the semiconductor substrate or wafer 204 or may extend as trenches 212 into the semiconductor substrate or wafer 204. In other embodiments, instead of a laser scribing process, patterning of the mask may be achieved by, e.g., screen printing a patterned mask, photo-lithography, or by applying a pre-patterned dry laminate mask.

Figure 2F:
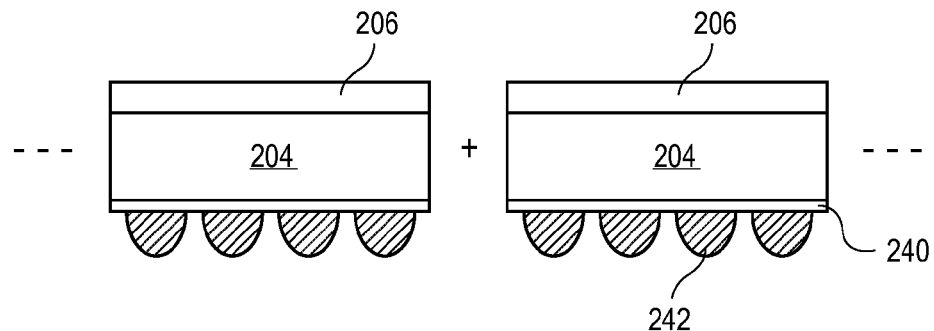

Referring to FIG. 2F, a plasma etch process is used to singulate the semiconductor substrate or wafer 204 into individual ICs (i.e., as individual ICs 206). In an embodiment, the plasma etch is performed through scribe lines 210, using the laser scribed mask 202 to protect the integrated circuits 206 during the plasma etching. Referring again to FIG. 2F, following singulation, subsequent processing may include one or more of mask 202 material removal, die cleaning, and die pick from the dicing film or tape 298, in any suitable ordering of operations. In one embodiment, the mask 202 is a water soluble mask and is removed with an aqueous treatment. In one embodiment, the dicing tape 298 is a UV-curable tape, and release of the dies is assisted by a UV cure of the dicing tape 298.

In an embodiment, after dicing, die side wall cleaning (e.g. F removal) may be needed. For example, an etch residue generated during the plasma etching of FIG. 2F may be removed with a cleaning operation. In an embodiment, removing the etch residue involves removing a fluorine (F)-based residue from the sidewalls of the singulated integrated circuits 204/206. In an embodiment, removing the etch residue involves using a plasma cleaning process such as, but not limited to, an $O_2$ plasma cleaning process, an $Ar/O_2$ plasma cleaning process, a forming gas ($H_2/N_2$) plasma cleaning process, an $Ar/O_2/SF_6$ plasma cleaning process, or a combination of two or more thereof. In one embodiment, the plasma cleaning is performed as an in situ post treatment in the plasma etch chamber used for singulation. In another embodiment, the plasma cleaning is performed in a different etch chamber than the plasma etch chamber used for singulation. In one embodiment, the etch residue is removed from the sidewalls of the singulated integrated circuits prior to removing the mask material 202. In another embodiment, the etch residue is removed from the sidewalls of the singulated integrated circuits subsequent to removing the mask material 202.

Referring again to FIGS. 2A-2F, in accordance with an embodiment of the present invention, since only surface scribing (laser portion) rather than through thickness cutting is involved, the rigidity of the backside mounted wafer is not an issue. A dry film vacuum lamination approach is used to mount a wafer backside (with bumps) onto a dicing tape. By contrast, if the wafer front side is otherwise mounted onto a dicing tape, the laser scribing and plasma etching would have to be performed from the backside. However, plasma etching through the silicon substrate may prove difficult particularly when etching through remaining device layers on the street, since film stacks along dicing street on front side are typically non-uniform. Furthermore, adding a laser process to remove remaining device layers would otherwise pose challenges with respect to unloading the wafer from a plasma chamber and loading onto a laser scribing stage without breaking the remaining thin device layers. Additionally, difficulty would arise in focusing the laser beam down to the etched trench bottom with clear vision. Potentially even more problematic, typical laser processing causes dicing tape damage when cutting through device layer sitting on the dicing tape. For example, the debris from ablated device layer materials (particularly metals) and dicing tape polymers can be splashed onto die sidewalls causing unacceptable contamination. Embodiments described herein may be implemented to circumvent such issues.

Thus, in accordance with an embodiment of the present invention, a combination of front side laser scribing and plasma etching is used to dice a semiconductor wafer into individualized or singulated integrated circuits, where metal bumps are formed prior to the singulation operations. In one such embodiment, the laser scribing operation is used as an essentially, if not totally, non-thermal process. For example, the front side laser scribing may be localized with no or negligible heat damage zone. In an embodiment, approaches herein are used to singulate integrated circuits having ultra-low k films, and wafers having metallization and device layers on the front surface and having metal bumps and associated dielectric layers on the back surfaces.

In an embodiment, the semiconductor wafer or substrate 204 that is scribed is composed of a material suitable to withstand a fabrication process and upon which semiconductor processing layers may suitably be disposed. For example, in one embodiment, the semiconductor wafer or substrate is composed of a group IV-based material such as, but not limited to, crystalline silicon, germanium or silicon/germanium. In a specific embodiment, providing the semiconductor wafer includes providing a monocrystalline silicon substrate. In a particular embodiment, the monocrystalline silicon substrate is doped with impurity atoms. In another embodiment, the semiconductor wafer or substrate is composed of a III-V material such as, e.g., a III-V material substrate used in the fabrication of light emitting diodes (LEDs).

In an embodiment, the semiconductor wafer or substrate 204 has disposed on its front side an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. One or more of the dielectric layers can be a low-k dielectric layer. A low K dielectric layer is a layer having a dielectric constant of less than the dielectric constant of 4.0 for silicon dioxide. In a specific embodiment, the low K dielectric layers are composed of a carbon-doped silicon oxide material.

Referring again to FIG. 2D, in an embodiment, the mask layer 202 is or includes a layer such as, but not limited to, a water-soluble layer, a UV-curable mask layer, a photo-resist layer, or a Teflon or Teflon-like (polymeric $CF_2$) layer.

In the case that mask layer 202 is a water-soluble mask layer, in an embodiment, the water-soluble layer is readily dissolvable in an aqueous media. For example, in one embodiment, the water-soluble layer is composed of a material that is soluble in one or more of an alkaline solution, an acidic solution, or in deionized water. In an embodiment, the water-soluble layer maintains its water solubility upon a heating process, such as heating approximately in the range of 50-160 degrees Celsius. For example, in one embodiment, the water-soluble layer is soluble in aqueous solutions following exposure to chamber conditions used in a laser and plasma etch singulation process. In one embodiment, the water-soluble die layer is composed of a material such as, but not limited to, polyvinyl alcohol, polyacrylic acid, dextran, polymethacrylic acid, polyethylene imine, or polyethylene oxide. In a specific embodiment, the water-soluble layer has an etch rate in an aqueous solution approximately in the range of 1-15 microns per minute and, more particularly, approximately 1.3 microns per minute. In another specific embodiment, the water-soluble layer is formed by a spin-on technique.

In the case that mask layer 202 is a UV-curable mask layer, in an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In the case that mask layer 202 is a photo-resist layer, in an embodiment, the mask layer is composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In the case that mask layer 202 is a Teflon or Teflon-like (polymeric $CF_2$) layer, in an embodiment, forming the mask involves forming a layer deposited in a plasma deposition process. For example, in one such embodiment, a polymeric $CF_2$ layer is deposited in a plasma deposition process involving the gas $C_4F_8$.

In an embodiment, the front side laser scribing process involves using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as low-k dielectric layers and backside metallization layers.

Figure 3:
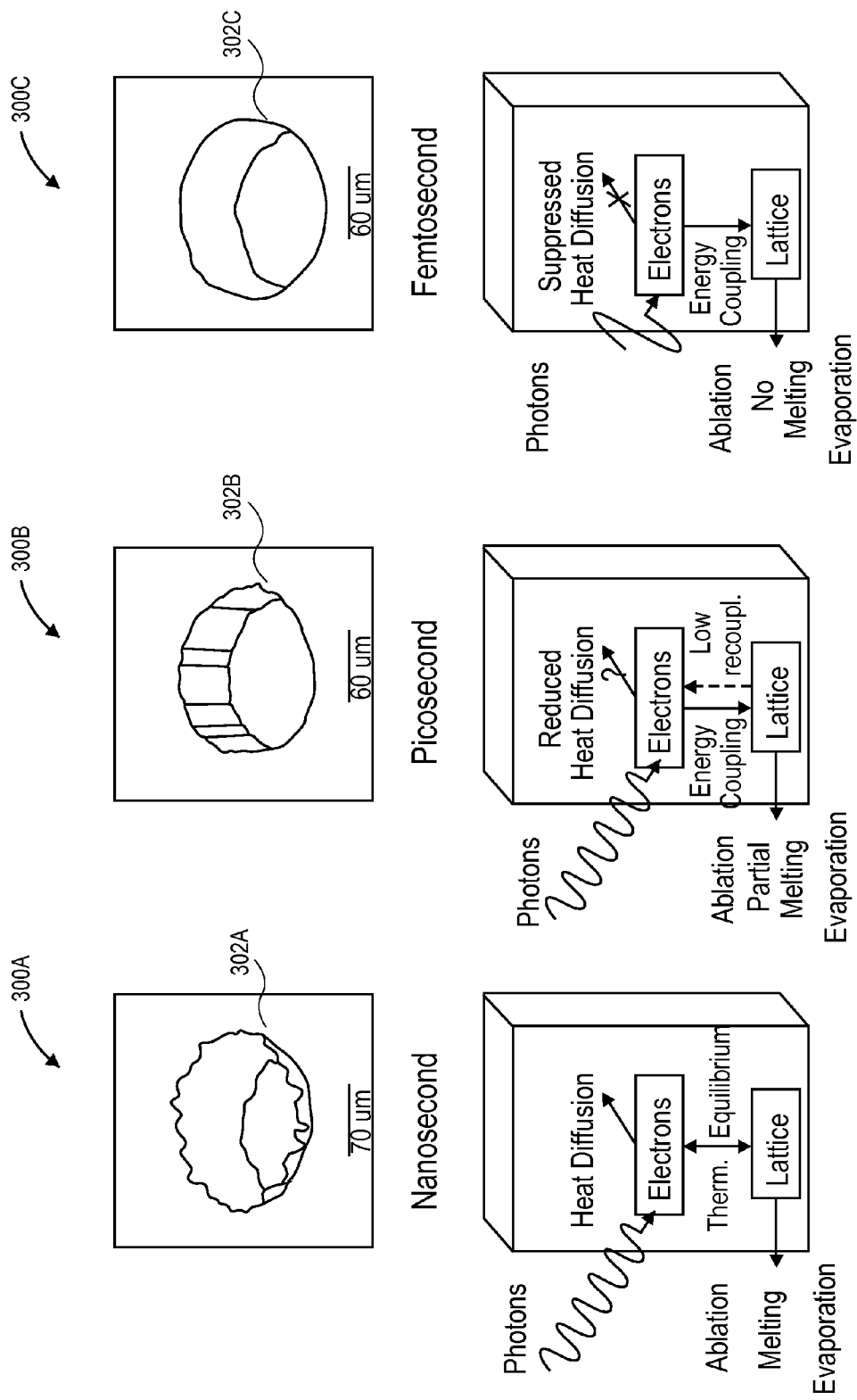
FIG. 3 illustrates the effects of using a laser pulse in the femtosecond range versus longer pulse times, in accordance with an embodiment of the present invention.

FIG. 3 illustrates the effects of using a laser pulse in the femtosecond range versus longer frequencies, in accordance with an embodiment of the present invention. Referring to FIG. 3, by using a laser with a pulse width in the femtosecond range heat damage issues are mitigated or eliminated (e.g., minimal to no damage 302C with femtosecond processing of a via 300C) versus longer pulse widths (e.g., damage 302B with picosecond processing of a via 300B and significant damage 302A with nanosecond processing of a via 300A). The elimination or mitigation of damage during formation of via 300C may be due to a lack of low energy recoupling (as is seen for picosecond-based laser ablation) or thermal equilibrium (as is seen for nanosecond-based laser ablation), as depicted in FIG. 3. However, nano-second, picosecond- or femtosecond-based laser scribing may be considered for embodiments herein.

As mentioned above, in an embodiment, etching the semiconductor wafer or substrate includes using a plasma etching process. In one embodiment, an ultra-high-density plasma source is used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon may be used. In a specific embodiment, the etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In an embodiment, a through-silicon via type etch process is used for the plasma etching operation described in association with FIG. 2F. For example, in a specific embodiment, the etch rate of the material of semiconductor wafer 204 is greater than 25 microns per minute. In an exemplary embodiment, a deep silicon etch is used to etch a single crystalline silicon substrate or wafer at an etch rate greater than approximately 40% of conventional silicon etch rates while maintaining essentially precise profile control and virtually scallop-free sidewalls. In another embodiment, the plasma etching operation described in association with FIG. 2F employs a conventional Bosch-type dep/etch/dep process to etch through the substrate. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which can be rough. This is particularly the effect where the laser scribing process generates an open trench much rougher than that which a lithographically defined etch process achieves. Such a rough die edge leads to lower than expected die break strength. In addition, the deposition sub-step in a Bosch process generates a fluorine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (approximately 0.15 um/min) so the smoothening treatment is more controllable. The high bias power is applied to achieve relatively high directional etch rates to etch off the ridges or rims on the sidewall.

As an additional process operation between FIGS. 2E and 2F, in accordance with an embodiment of the present invention, an intermediate post laser scribing/pre plasma etching cleaning operation is performed. In an embodiment, the post laser scribing/pre plasma etching cleaning operation is a plasma-based cleaning process. In a first example, as described below, the plasma-based cleaning process is reactive to the regions of the wafer exposed by the laser scribing process. In the case of a reactive plasma-based cleaning process, the cleaning process itself may form or extend trenches in the wafer since the reactive plasma-based cleaning operation is at least somewhat of an etchant for the wafer. In a second, different, example, as is also described below, the plasma-based cleaning process is non-reactive to the regions of the wafer exposed by the laser scribing process.

In accordance with a first embodiment, the plasma-based cleaning process is reactive to exposed regions of the wafer (e.g., a silicon wafer) in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist masks, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the wafer (e.g., a silicon wafer) in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks. In another such embodiment, separate mask condensation and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) Ar+$SF_6$ highly-biased plasma cleaning of laser scribed trenches, and (c) Ar or non-reactive gas (or the mix) highly-biased plasma treatment for mask condensation. In accordance with another embodiment of the present invention, a plasma cleaning operation involves first use of a reactive plasma cleaning treatment. The reactive plasma cleaning treatment is then followed by a non-reactive plasma cleaning.

In another embodiment, a plurality of integrated circuits may be separated by streets having a width of approximately 10 microns or smaller. The use of a front side laser scribing and plasma etching dicing approach for a wafer having backside solder bumps, at least in part due to the tight profile control of the laser, may enable such compaction in a layout of integrated circuits. For example, FIG. 4 illustrates compaction on a semiconductor wafer or substrate achieved by using narrower streets versus conventional dicing which may be limited to a minimum width, in accordance with an embodiment of the present invention.

Figure 4:
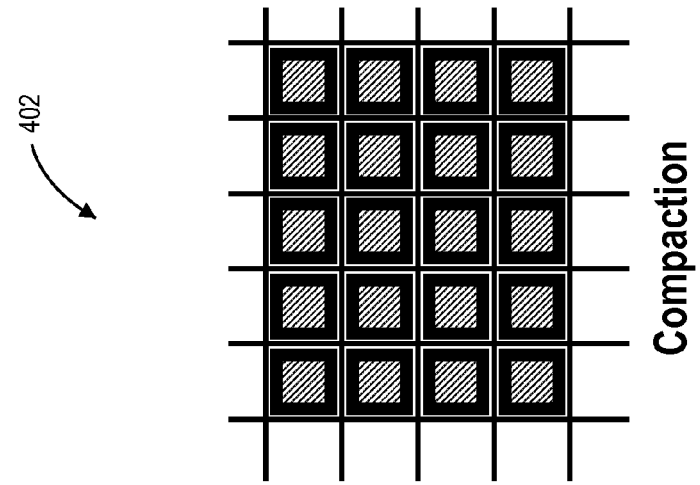
FIG. 4 illustrates compaction on a semiconductor wafer achieved by using narrower streets versus conventional dicing which may be limited to a minimum width, in accordance with an embodiment of the present invention.
Figure 4:
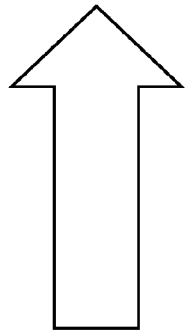
Figure 4:
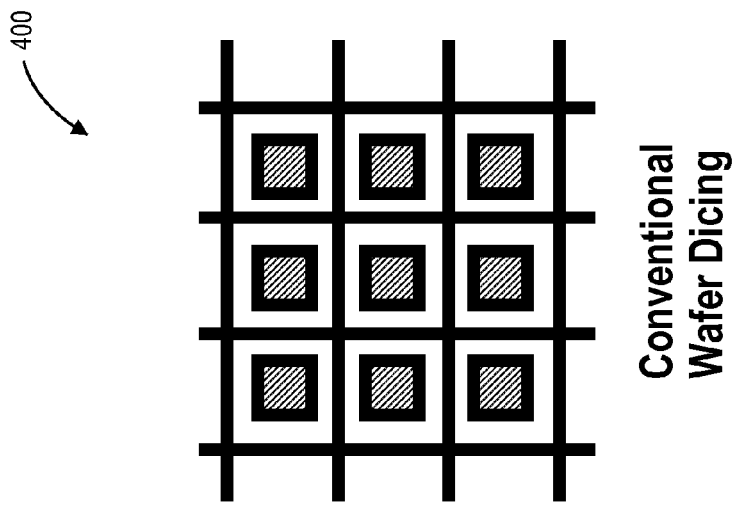

Referring to FIG. 4, compaction on a semiconductor wafer is achieved by using narrower streets (e.g., widths of approximately 10 microns or smaller in layout 402) versus conventional dicing which may be limited to a minimum width (e.g., widths of approximately 70 microns or larger in layout 400). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 5:
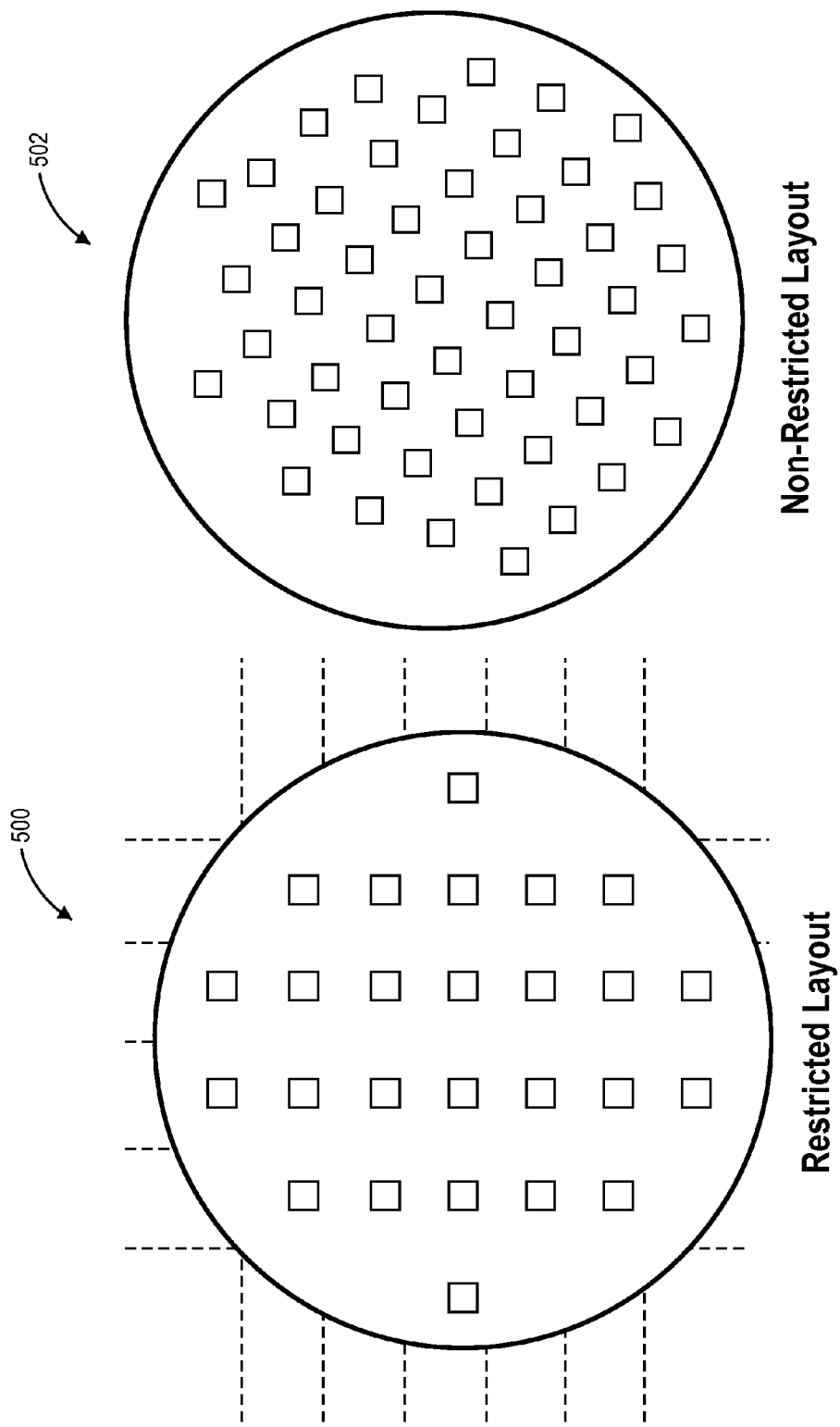
FIG. 5 illustrates freeform integrated circuit arrangement allowing denser packing and, hence, more die per wafer versus grid alignment approaches, in accordance with an embodiment of the present invention.

In another embodiment, a plurality of integrated circuits may be arranged on a semiconductor wafer or substrate in a non-restricted layout. For example, FIG. 5 illustrates freeform integrated circuit arrangement allowing denser packing. The denser packing may provide for more die per wafer versus grid alignment approaches, in accordance with an embodiment of the present invention. Referring to FIG. 5, a freeform layout (e.g., a non-restricted layout on semiconductor wafer or substrate 502) allows denser packing and hence more die per wafer versus grid alignment approaches (e.g., a restricted layout on semiconductor wafer or substrate 500). In an embodiment, the speed of the laser ablation and plasma etch singulation process is independent of die size, layout or the number of streets.

A single process tool may be configured to perform many or all of the operations in a hybrid laser scribe and plasma etch dicing process for a wafer having backside solder bumps. For example, FIG. 6 illustrates a block diagram of a tool layout for laser and plasma dicing of wafers or substrates having backside solder bumps, in accordance with an embodiment of the present invention.

Figure 6:
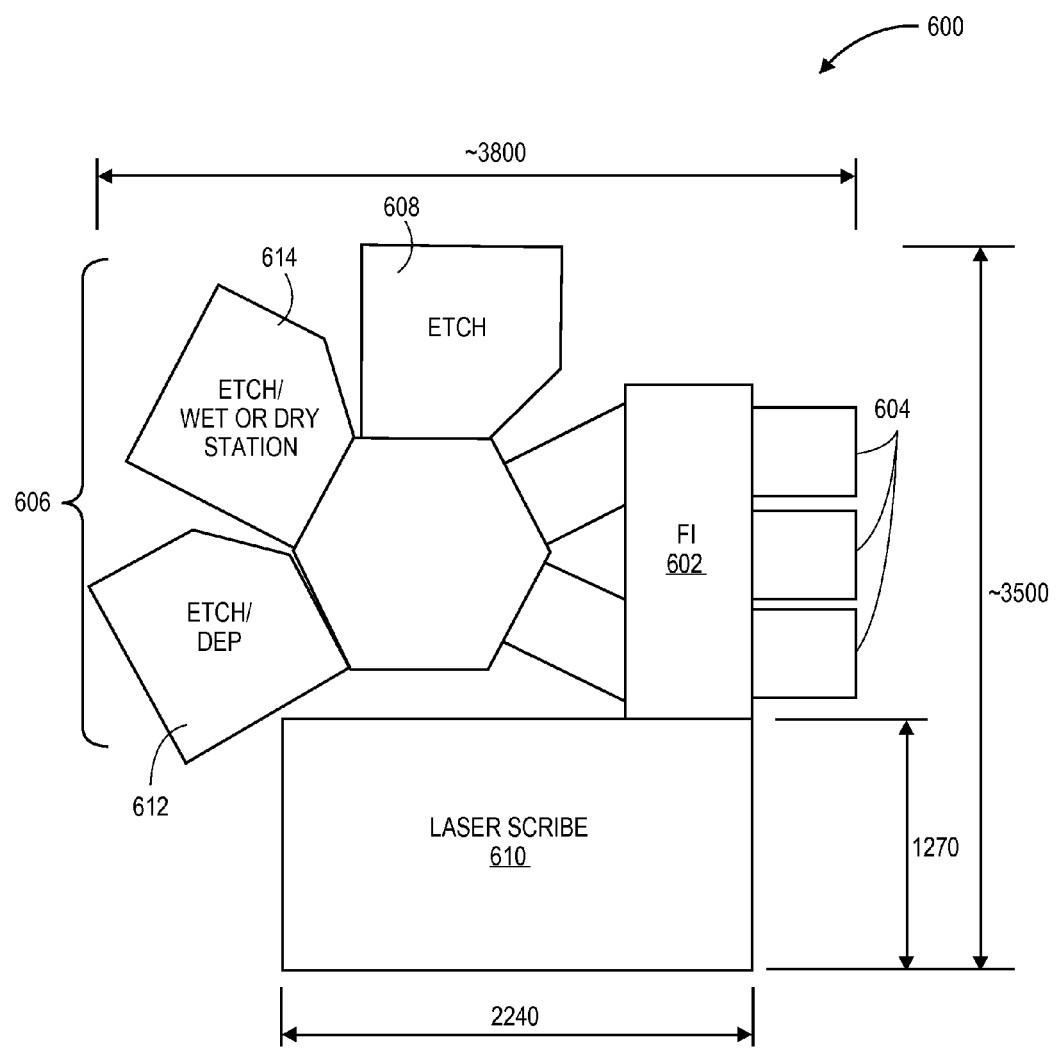
FIG. 6 illustrates a block diagram of a tool layout for laser scribing and plasma dicing of wafers or substrates having backside solder bumps, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a nanosecond, picosecond- or femtosecond-based laser, and preferably a femto-second based laser. The nanosecond, picosecond- or femtosecond-based laser is suitable for performing a front side laser ablation portion of a laser and etch singulation process, such as the laser ablation processes described above. In one embodiment, a moveable stage is also included in laser scribe apparatus 600, the moveable stage configured for moving a wafer or substrate (or a carrier thereof) relative to the picosecond- or femtosecond-based laser. In a specific embodiment, the nanosecond-, picosecond- or femtosecond-based laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is an Applied Centura® Silvia™ Etch system, available from Applied Materials of Sunnyvale, Calif., USA. The etch chamber may be specifically designed for a silicon etch or treatment used in a process to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, in place of an additional etch chamber, a deposition chamber 612 is included. The deposition chamber 612 may be configured for mask deposition on or above a front side of a wafer or substrate prior to laser scribing from the front side of the wafer or substrate. In one such embodiment, the deposition chamber 612 is suitable for depositing a water soluble mask layer. In another embodiment, in place of an additional etch chamber, a wet/dry station 614 is included. The wet/dry station may be suitable for cleaning residues and fragments, or for removing a water soluble mask, e.g., subsequent to a laser scribe and plasma etch singulation process from the front side of a substrate or wafer. In another embodiment, the deposition chamber 612 is suitable for depositing a UV-curable mask layer, and a UV source is included with the tool. In an embodiment, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
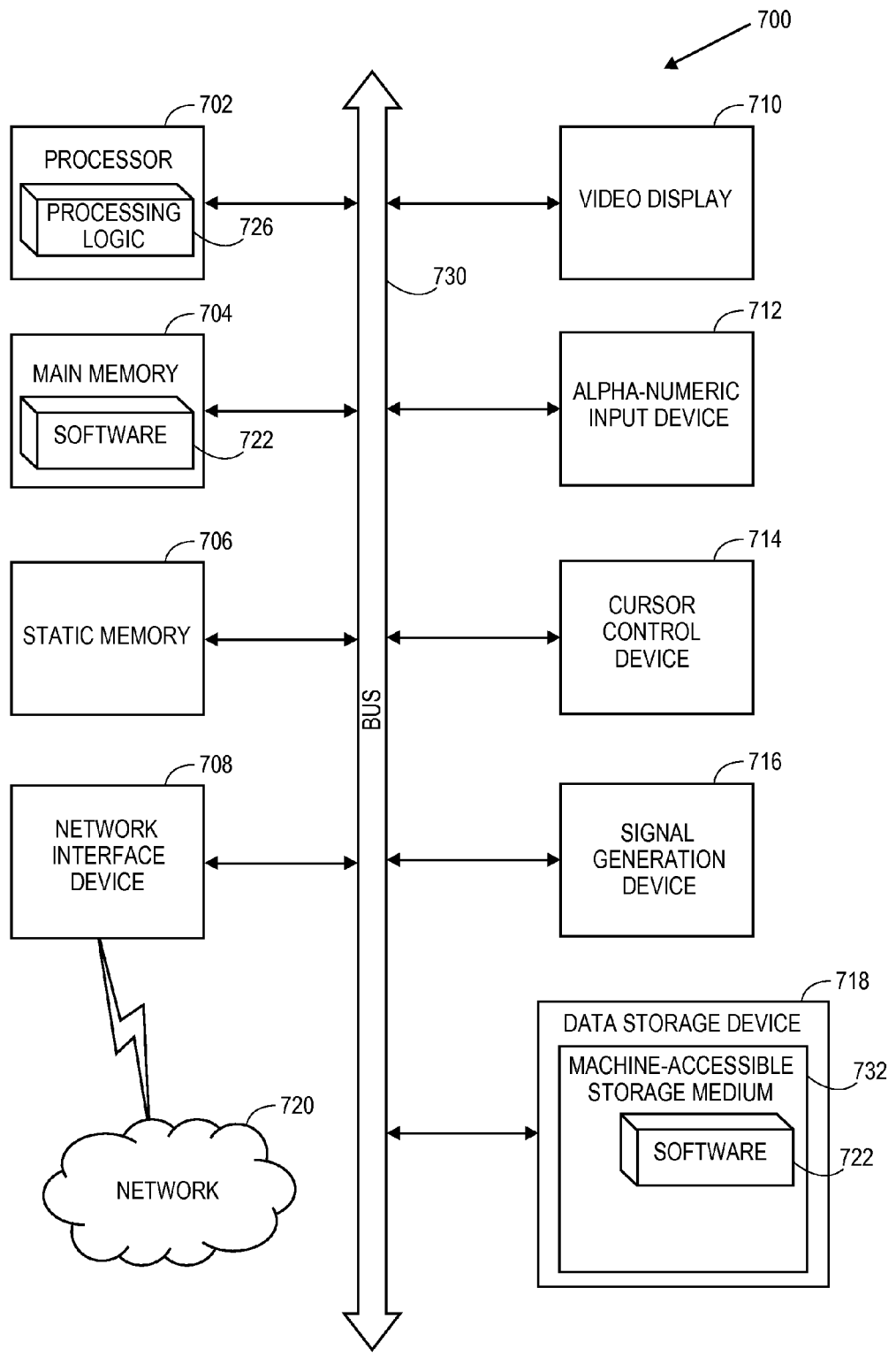
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media. In accordance with an embodiment of the present invention, a machine-accessible storage medium has instructions stored thereon which cause a data processing system to perform an above described method of dicing a semiconductor wafer having a plurality of integrated circuits.

Thus, approaches for hybrid laser scribe and plasma etch dicing process for a wafer having backside solder bumps have been disclosed.

What is claimed is:

1. A method of dicing a substrate comprising device regions on a front side thereof and corresponding arrays of metal features on a backside thereof, the method comprising:

providing the substrate having a carrier film applied to the backside thereof, the carrier film covering the arrays of metal features, the substrate also having a patterned mask on the front side thereof, the patterned mask covering the device regions and having scribe lines between the device regions; and plasma etching the substrate through the scribe lines to singulate the device regions, the patterned mask protecting the device regions during the plasma etching.

2. The method of claim 1, wherein the scribe lines of the patterned mask are formed by a laser scribing process.

3. The method of claim 1, wherein the carrier film is a UV-curable film, the method further comprising:

subsequent to singulating the device regions, demounting the device regions from the carrier film by irradiating the UV-curable film with UV light.

4. The method of claim 1, wherein the carrier film is a thermally-curable film, the method further comprising:

subsequent to singulating the device regions, demounting the device regions from the carrier film by heating the thermally-curable film.

5. The method of claim 1, wherein the patterned mask is a water-soluble patterned mask, the method further comprising:

subsequent to singulating the device regions, removing the water-soluble patterned mask with an aqueous-based treatment.

6. The method of claim 1, wherein the scribe lines include trenches formed partially into the front side of the substrate, and plasma etching the substrate through the scribe lines comprises forming corresponding trench extension in the substrate.

7. The method of claim 1, wherein the substrate and carrier film pairing comprises a void between the backside of the substrate and the carrier film, and wherein the void has a pressure substantially less than 1 atm.

* * * * *